United States Patent [19]

Lauks et al.

[11] Patent Number: 5,008,616
[45] Date of Patent: Apr. 16, 1991

[54] FLUIDICS HEAD FOR TESTING CHEMICAL AND IONIC SENSORS

[75] Inventors: Imants R. Lauks, Morrisville, Pa.; Henry J. Wieck, Plainsboro; Gregory M. Bandru, Ewing, both of N.J.

[73] Assignee: I-Stat Corporation, Princeton, N.J.

[21] Appl. No.: 434,660

[22] Filed: Nov. 9, 1989

[51] Int. Cl.$^5$ .................. G01R 31/02; G01N 27/00; H01L 29/66
[52] U.S. Cl. .................. 324/158 F; 73/1 R; 357/25
[58] Field of Search ............ 324/158 F, 158 R, 158 P; 73/1 R, 1 G; 357/25

[56] References Cited

U.S. PATENT DOCUMENTS

4,864,229 9/1989 Lauks et al. .................. 324/158 F

Primary Examiner—Ernest F. Karlsen

[57] ABSTRACT

A fluidics head to facilitate the automatic testing of chemical and ionic sensing electronic circuit devices is provided. The fluidics head comprises a fluid confining cell having an open orifice capable of containing a known test fluid while the orifice is in leakproof engagement with sensing electronic circuit devices, an inlet and outlet opening capable of filling and discharging test fluids, and electrical probes capable of contacting the sensing electronic circuit devices so as to test the electrical response of the devices with the test fluids.

8 Claims, 6 Drawing Sheets

FLUIDICS HEAD FOR TESTING CHEMICAL AND IONIC SENSORS

FIELD OF THE INVENTION

This invention relates to ambient sensing devices such as ion sensitive and chemically sensitive devices and to methods of testing such devices in appropriate environments.

BACKGROUND OF THE INVENTION

It frequently is desirable to monitor the composition of the chemical environment, for example, to regulate chemical or biochemical processes, to determine air or water quality, or to measure parameters of interest in biomedical, agricultural or animal husbandry disciplines.

Because of the nature of the chemical environment, it is desirable that any measurement apparatus have at least some of the properties of: low cost, simple fabrication methodology, digital operation, some degree of signal preconditioning or intelligence, small size, high chemical sensitivity with selectivity, multiple species information with specificity, choice of reversible or integrating response to chemical species, temperature insensitivity or compensation and low power requirement. In addition, the measurement apparatus should have good long term electrochemical stability, good physical resiliency and strength and good resistance to corrosion and chemical attack. In the case of electrical measurement devices, the devices should also have low electrical impedance to provide good signal to noise ratios. With chemically sensitive devices, the devices should also have a Nernstian response to the chemical phenomena being measured.

One method for the detection, measurement and monitoring of the chemical properties of a substance involves the measurement of an electric potential where the potential is dependent upon the chemical activity being measured. Bergveld has proposed that hydrogen and sodium ion activities in an aqueous solution be measured by a metal oxide semiconductor field-effect transistor (MOSFET) modified by removal of the gate metal. P. Bergveld, "Development, Operation, and Application of the Ion-Sensitive Field-Effect Transistor as a Tool for Electrophysiology" *IEEE Transactions of Biomedical Engineering*, Vol. BME-19, pages 342-351 (September, 1972). In particular, if a MOSFET with no gate metal were placed in an aqueous solution, Bergveld suggested that the silicon dioxide insulation layer would become hydrated and then, because of impurities in the hydrated layer, ion selective. After hydration of the insulation layer of the MOSFET, Bergveld believed the device could be used for ion activity measurement by immersing the device in the solution in question and then recording conductivity changes of the device. Thus, the Bergveld device is commonly referred to as an ion-sensitive field effect transistor (ISFET).

Bergveld's work led to other developments in the field of ion sensitive electrodes such as the chemical sensitive field effect transistor (CHEMFET) device described in U.S. Pat. No. 4,020,830. As described in the '830 patent, the CHEMFET is a MOSFET in which the gate metal has been replaced by a chemically sensitive system that is adapted to interact with certain substances to which the system is exposed. Thus as shown in FIGS. 1 and 2 of the '830 patent, the CHEMFET is identical in structure to a MOSFET except for a sensing layer or membrane 38 that is deposited in place of a metal gate layer on the oxide insulator above the channel region of the transistor and, optionally, an impervious layer 44 that covers all other parts of the CHEMFET that might be exposed to the solution. Numerous variations on CHEMFET structures are disclosed, for example, in U.S. Pat. Nos. 4,180,771, 4,218,298, 4,232,326, 4,238,757, 4,305,802, 4,332,658, 4,354,308, 4,485,274, 4,397,714, and 4,739,380 and in U.S. patent application Ser. No. 07/270,171, now abandoned.

The concept of an ISFET or CHEMFET is especially attractive because of the promise it holds that the high volume, low cost fabrication techniques that are used to manufacture field effect transistors (FETs) in integrated circuits may somehow be adapted for the manufacture of ISFETs and CHEMFETs. Advances in such technology are disclosed, for, example, in the above-referenced U.S. Pat. No. 4,739,380 and U.S. patent application No. 07/270,171, now abandoned.

One problem encountered in the fabrication of integrated circuits (ICs) is the testing of such devices. Because integrated circuits are so small and yet so complicated, testing imposes major problems in the handling of ICs and in the design of appropriate testing devices and protocols. At the same time, testing is needed as a process control to ensure that the IC manufacturing process is operating as desired and to identify the inevitable number of ICs that do not meet specifications for whatever reason. Testing is a particular problem in the manufacture of ISFETs and CHEMFETs since these devices are transducers which convert environmental variables to an electrical signal. Complete testing of such devices requires that the testing be carried out by exposing the ion sensing or chemical sensing layer of these devices to the environment which the ISFETs and CHEMFETs are designed to measure. One manner of testing is disclosed in U.S. Pat. No. 4,864,229.

A critical component of the testing of integrated circuits is the fluidics head which contains the test fluid which the ISFETs and CHEMFETs are designed to measure. The fluidics head must provide leakproof engagement with the sensing electronic circuit device to be tested so that neighboring devices on the wafer are not contaminated by the test fluid. Additionally, because small volumes or test fluids (on the order of 20–100 $\mu$l) need to be handled and because of the small size of the devices, great care must be used to avoid entrapment of air bubbles and fluid contamination during the testing of the devices and upon changing from one test fluid to another. The fluidics head must be designed to test devices lying on a variety of planar wafer materials. These materials include alumina, high melting plastics, glass, silicon, silicon dioxide and silicon nitride.

SUMMARY OF THE INVENTION

It is an object of the present invention to provide a fluidics head which is capable of rapid leakproof engagement and rapid breaking of leakproof engagement with a planar wafer surface thereby facilitating rapid testing of sensing electronic circuit devices lying on the planar wafer surface.

It is another object of the present invention to provide a fluidics head which is structurally strong and capable of providing leakproof engagement with the sensing electronic circuit device over a wide range of fluid flow rates.

Another object is to provide a fluidics head which permits the exposure of one or more sensing electronic circuit devices to one or more test fluids without significant entrapment of air bubbles or test fluid contamination.

These and other objects of the invention as well as the advantages are the subject of the following detailed description and claims.

The foregoing objects are achieved according to the present invention by means of a fluidics head for automatically testing chemical and ionic sensing electronic circuit devices comprising (a) a fluid confining cell having at least one open orifice to contain a known test fluid, (b) means for filling a test fluid into said open orifice and discharging the test fluid from the open orifice when the cell is in leakproof engagement with a sensing electronic circuit device to be tested, and (c) means for providing electrical contacts to the sensing electronic circuit device so as to test the sensing electronic circuit device with the test fluid. Such a means for providing electrical contacts, for example, may be obtained by use of spring loaded probes contacting the electrical leads of the integrated circuit of the sensing electronic circuit device.

Typically, the means for filling and discharging the test fluid from the open orifice comprises one inlet opening and one outlet opening in the fluid confining cell. Preferably, the inlet opening and the outlet opening are at opposite ends of the fluid confining cell. The open orifice which is connected to the inlet and outlet openings has an internal shape which minimizes the entrapment of air or residual test fluid upon filling the fluid confining cell with a test fluid and upon discharging the test fluid from the fluid confining cell. Preferably, the internal shape is such that the open orifice is shaped at its ends to closely conform to the shape of the inlet and outlet openings. Most preferably, the internal shape comprises ends approximating half sections of paraboloids with no angled corners so as to permit the maximum degree of laminar flow and thus minimize non-lamimar flow of the test fluid through the fluid confining cell. Generally, all angles should be as obtuse as is feasible with a single molded piece.

Another possible manner of contaminating the test fluid is the depletion of species during the testing of the sensing electronic circuit devices. This is evident in sensing electronic circuit devices principally relying on amperometric methods in which the bulk concentration of electroactive species is changed by the oxidation or reduction reactions occurring at the electrode solution interface. This is especially evident when small volumes of test fluids are used. Thus, in order to accommodate such changes in concentration, the internal volume of the fluid confining cell having an open orifice must be sufficient to permit bulk solution characteristics to prevail. Preferably, the volume of test solution must be sufficient to preclude any significant change in electroactive species concentration, i.e., less than or about 1% during the period of test.

The design of the fluid confining cell is such that when a vertical force is applied to the cell when in contact with a planar surface, the force vectors are predominantly compressive, thus minimizing lateral stress and obviating buckling. The fluid confining cell design is also optimized for the desired fluid dynamics based on observations of actual fluid flow as well as precision and accuracy measurements of the chemical and ionic sensing electronic circuit devices. The design is particularly directed towards high flow rates of fluids, where potential leakage problems are more pronounced. Particularly, the invention provides for a fluid confining cell having a supportive structure of sufficient strength to permit leakproof engagement with the sensing electronic circuit to be tested when the open orifice of the fluid containing cell is urged onto the circuit. Preferably, the supportive structure is wedge-like in shape with rounded outer edges. The rounded outer edges conform to the planar wafer surface on which the circuit is fabricated so as to form a leakproof seal.

The fluid confining cell is typically molded to the desired shape. The material used for the cell must satisfy several requirements. Among these requirements are (1) chemical inertness to the fluids used; (2) no adsorption of chemicals; (3) physical strength to provide controlled deformation and sealing, but to resist buckling when urged against a circuit to be tested and during fluid flow; and (4) ability to provide air and fluid seal.

BRIEF DESCRIPTION OF THE DRAWINGS

The above-described features and advantages of the invention will be more readily apparent from the following detailed description of the preferred embodiments of the invention, which is provided by way of illustration, and the appended figures in which:

FIGS. 4 (a) and 4 (b) show cross sectional views of two embodiments of the fluid confining cell.

FIGS. 5 (a), 5(b) and 5 (c) depict several views of a less preferred fluid confining cell having square corners. The corners (1) are potential entrapment/turbulent areas.

FIG. 6 (a) to (d) show several views of one embodiment of the frame which supports the fluid confining cell and spring loaded probes for fluidic and electrical contact with the sending electronic circuit device.

FIG. 8 (a) and (b) is a flow chart of the testing process employing the fluidics head of the invention.

DETAILED DESCRIPTION OF THE INVENTION

Figure 1A:
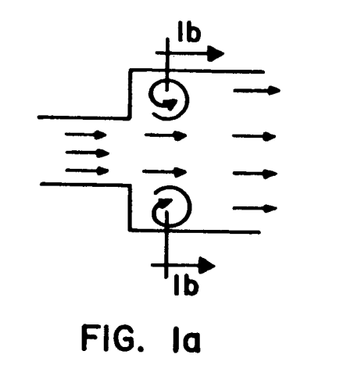
FIG. 1(a) and 1(c) illustrate the fluid flow effects when fluid initially enters the orifice of the fluid confining cell. To avoid the formation of recirculation zones at section 1(b), angled corners of the orifice are eliminated and the inlet opening is gradually increased in diameter as is illustrated in FIG. 1(c).
Figure 1C:
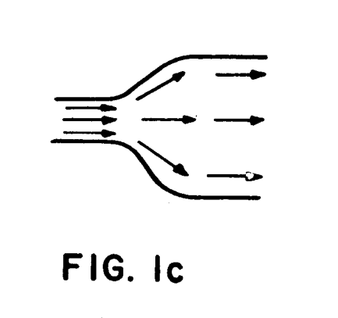

FIG. 1 (a) shows the separation of fluid flow at the edge of the orifice of the fluid confining cell just beyond the inlet opening. The main fluid flow maintains the original velocity immediately through the opening to form a commonly termed vena contracta at Section 1(b) of FIG. 1(a). The main fluid flow then decelerates to fill the orifice. This causes recirculation zones to form at the corners of the orifice which results in increased mixing, and trapping of suspended particles, fluid and air bubbles. Such adverse effects are substantially reduced by gradually increasing the diameter of the inlet opening. Therefore, the preferred embodiment of the fluid confining cell has an orifice with walls shaped as shown in FIG. 1(c) approximating the S-curve of two intersecting parabolas.

Figure 2A:
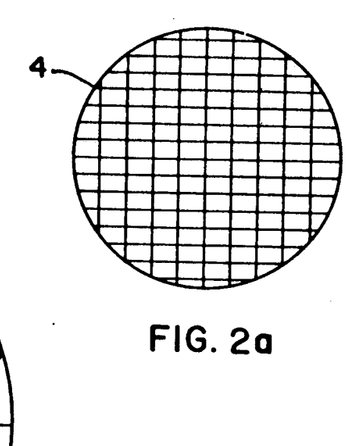
FIG. 2(a) represents the plane (4) of an integrated circuit chip.
Figure 2B:
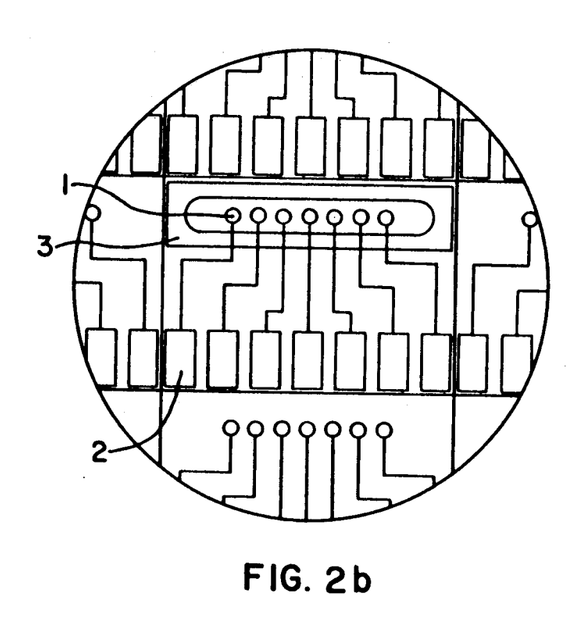
FIG. 2(b) illustrates an overview of a wafer comprising a plurality of sensing electronic circuit devices with an expanded view of one such device. The area (3) defines the location where the fluid confining cell establishes a leakproof engagement with the sensing electronic circuit devices (1).

FIG. 2(a) depicts the plane (4) of the integrated circuit chip onto which the outer edge of the fluid confining cell is urged. FIG. 2(b) depicts sensing electronic circuit devices having integrated circuit chips (1) which are physically offset from their electrical leads (2). The area (3) defines the seal formed when the outer edge of the fluid confining cell is urged onto the plane represented by FIG. 2(a) of the integrated circuit chip. As shown the fluidics head containing the fluid confining cell can be advantageously used in testing an extended gate field effect transistor (EGFET) such as that disclosed in the above-referenced U.S. Pat. No. 4,739,380.

Figure 3:
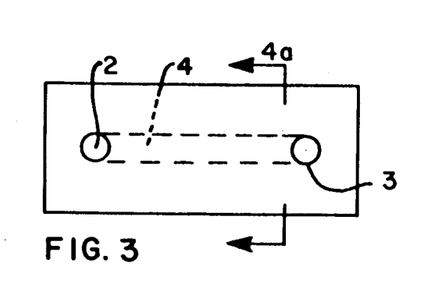
FIG. 3 shows a bottom view of one embodiment of the fluid confining cell.

FIG. 3 depicts the bottom view of the fluid confining cell (1). The inlet (2) and outlet (3) openings in which test fluid enters and discharges are located at opposite ends of the open orifice (4). The open orifice (4) of the cell closely conforms to the circumference of the inlet and outlet openings so as to permit the maximum degree of laminar flow of the test fluid within the cell.

The material used to fabricate the fluid confining cell must be chemically inert, unable to adsorb chemicals, of sufficient physical strength and able to provide air and fluid seal. Room-temperature Vulcanized materials (RTV) and silicone-based materials such as Silastic TM, an organopolysiloxane elastomer, made by Dow have been found to be especially useful in satisfying these requirements.

It is feasible that the fluid confining cell (1) may be comprised of more than one piece i.e. a solid fluid confining cell (1) with an inserted o-ring along the outer edge of the open orifice (4). However, such a design has several drawbacks. Compression of the o-ring leads to the formation of acute angles within the structure which promote the entrapment of air and other contaminants. Additionally, the number of interfaces is increased with concomittant increase in the number of potential leakage paths. Finally, the geometry of an o-ring limits the range of possible sealing designs of the fluidics head.

Figure 4A:
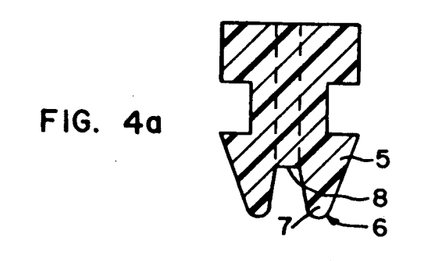
Figure 4B:
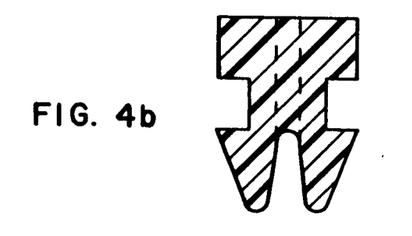

FIG. 4(a) depicts the cross sectional view of the fluid confining cell. The supportive structure (5) is wedge-like in shape with rounded outer edges (6) so as to provide leakproof engagement with the sensing integrated circuit chip when the cell is urged onto the plane of the integrated circuit chip. The acute angle made by the two sides of the support structure (7) is preferably more than 10 degrees. The radius of the rounded outer edge (6) is preferably 0.25 of the maximum internal width of the fluid confining cell. The top (8) of the fluid confining cell as shown is flat, as such a contour practically can be easily milled. However, the preferred contour is concave as shown in FIG. 4(b) which would permit the maximum degree of laminar flow.

Figure 5A:
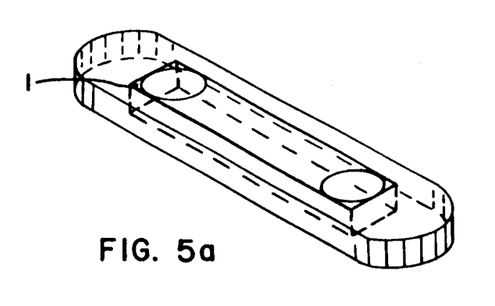
Figure 5B:
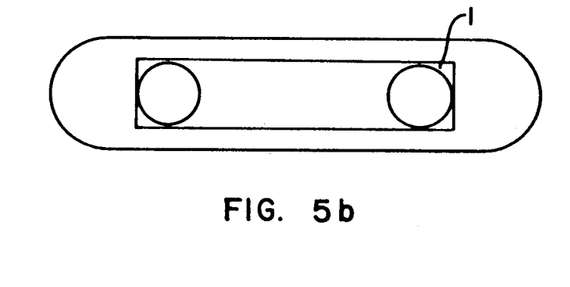
Figure 5C:
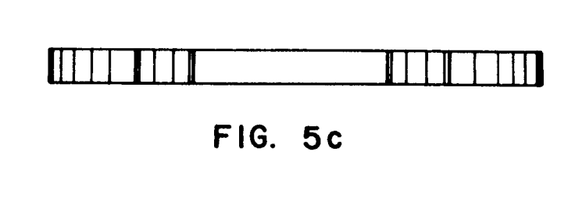

FIGS. 5(a) to (c) depict another less preferred embodiment of the fluid confining cell having square corners. FIG. 5(b) is a top view and FIG. 5(c) is a side elevation view. The areas near these square corners (1) present potential problems of air entrapment and contamination from residual test fluids due to recirculating flow. Such problems of mixing result in lower precision and accuracy in the measurement of the chemical and ionic sensing electronic circuit devices such as those described in FIG. 2. Such problems are especially noticeable where an individual sensing electronic circuit device is exposed to several test fluids in succession, thereby requiring a change of test fluids in the fluid confining cell.

Figure 6A:
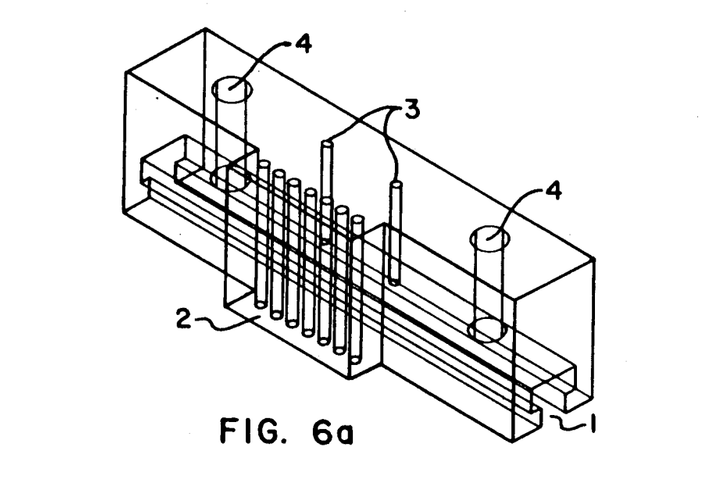
Figure 6B:
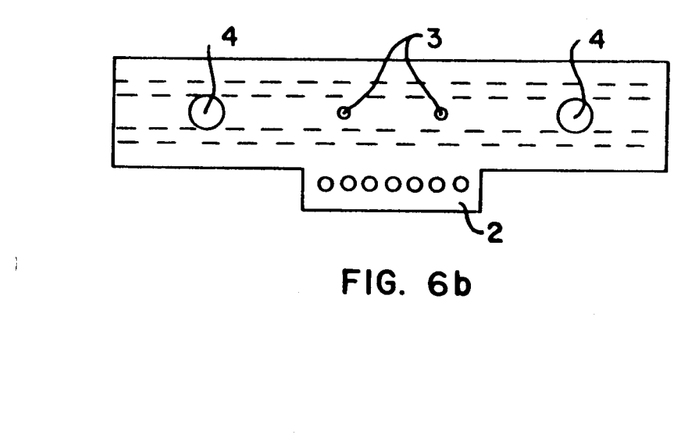
Figure 6C:
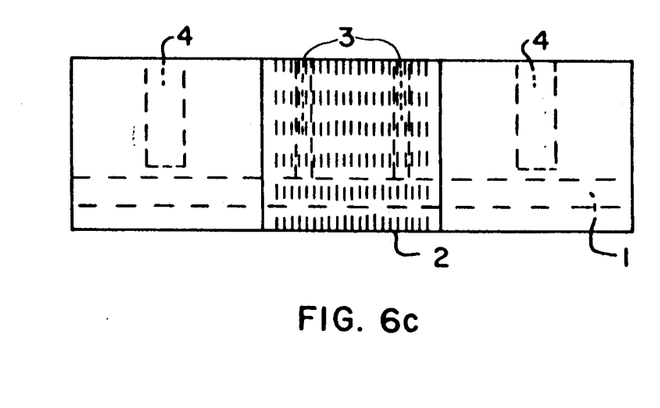
Figure 6D:
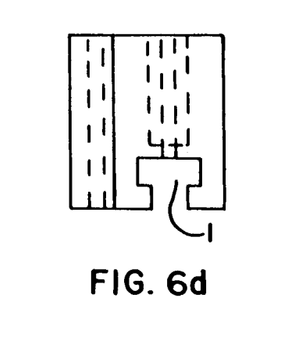

FIGS. 6(a) to (d) depict several views of the frame which supports the fluid confining cell and spring loaded probes for fluidic and electrical contact with the sensing electronic circuit device. FIG. 6(b) is a plan view of the top. FIG. 6(c) is a front elevation. FIG. 6(d) is an end elevation. The fluid confining cell is secured by sliding along track 1 to the center of the frame. The passages 2 hold a multiplicity of spring loaded probes. The passages 3 hold the tubing which is connected to the inlet and outlet openings of the fluid confining cell. The bores 4 allow the frame to be secured to an alignment apparatus and allows screw adjustments of the leveling of the fluid confining cell with respect to the planar wafer surface. The alignment apparatus automatically selects and positions in succession a multiplicity of sensing electronic circuit devices on a planar wafer surface for leakproof engagement with the fluid confining cell.

Figure 7:
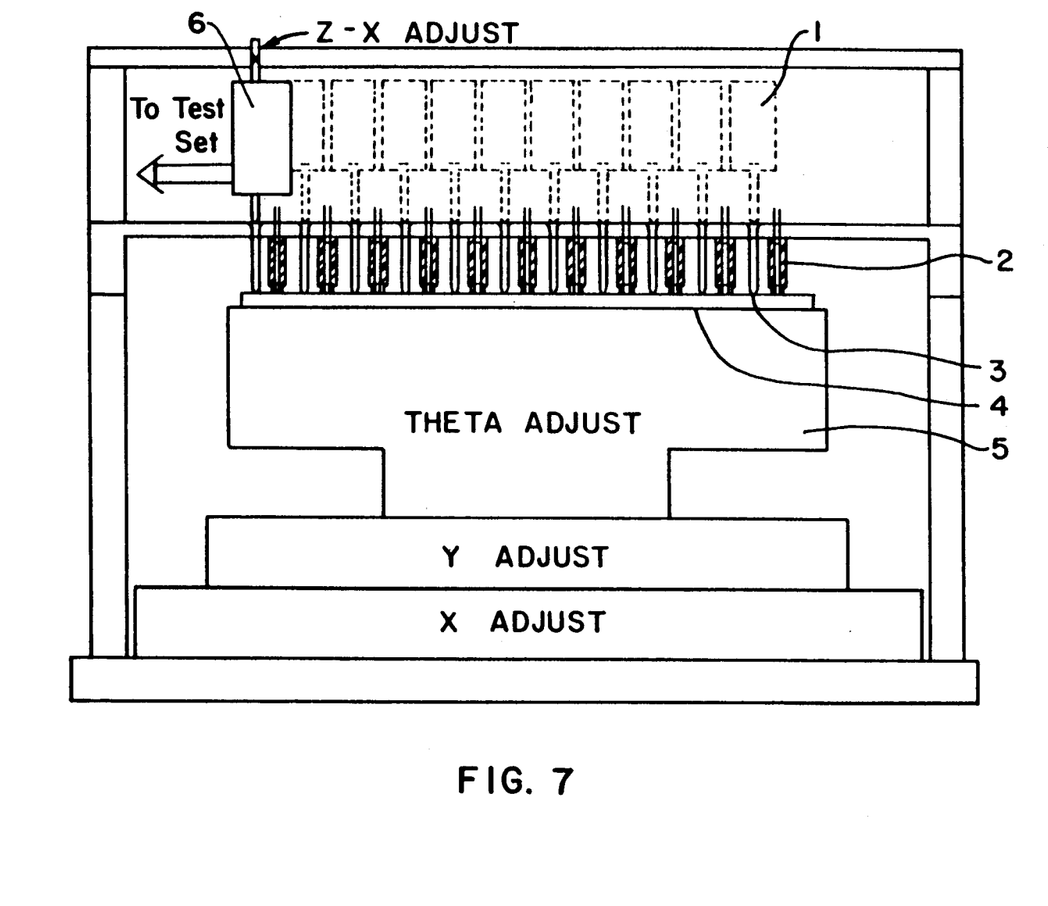
FIG. 7 is one embodiment of the testing apparatus having a multiplicity of fluidics heads for the simultaneous testing of a multiplicity of sensing electronic circuit devices on a wafer.

FIG. 7 illustrates one embodiment of the testing apparatus in which the frame 1 holds a multiplicity of fluid confining cells 2 along with their corresponding spring loaded probes 3. As shown, the fluid confining cells are urged against the surface of the wafer 4. The spacings of the fluid confining cells are such that these cells are urged into leakproof engagement with a multiplicity of sensing electronic circuit devices thus allowing these devices to be tested simultaneously.

The circuit devices 3 on the wafer 4 are aligned into position with respect to the fluid confining cells by an x,y and theta positioning table 5 which holds the wafer from below.

Amplifiers 6 connected to a data processing device are connected to the field effect transistors.

Figure 8A:
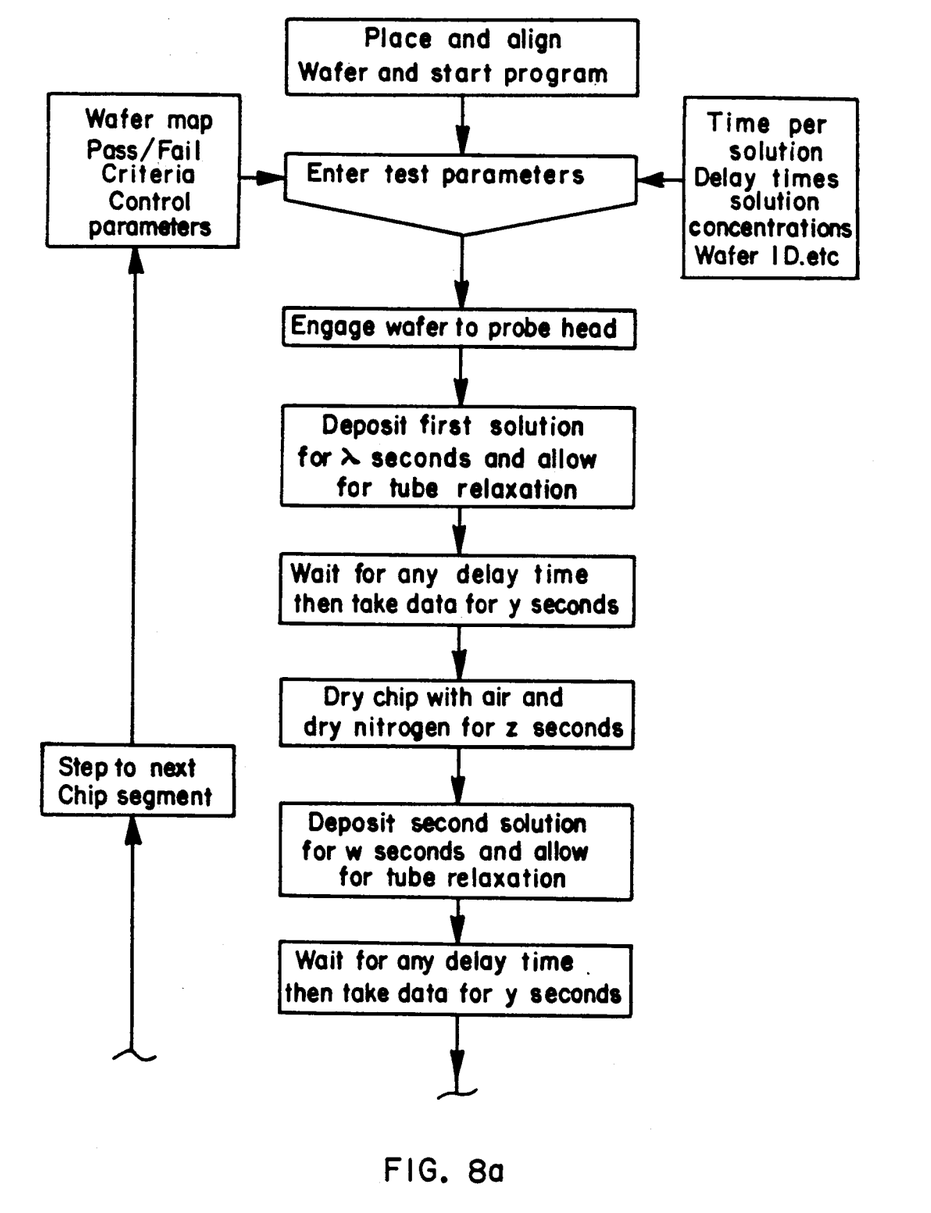
Figure 8B:
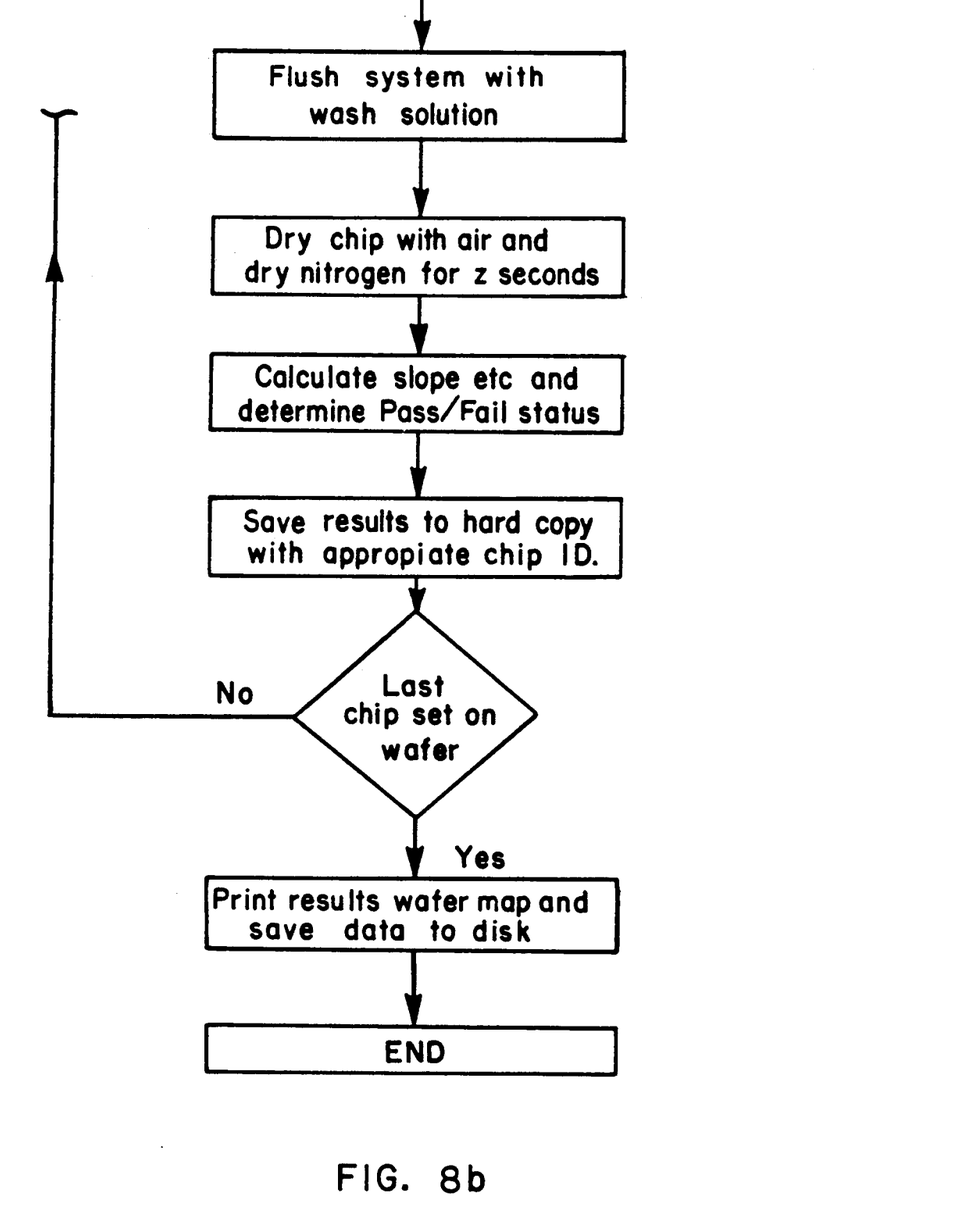

FIG. 8 outlines the flow chart used in testing a plurality of sensing electronic circuit devices employing the fluidics head of the present invention. The chart particularly shows that each device is tested with two solutions, although any number of solutions may be used.

The apparatus disclosed can be implemented or engineered in a number of ways. The description is intended to illustrate the principles and mode of operation of the fluidics head and not to rigidly define the structure or process. It is understood that changes and variations can be made therein without departing from the scope of the invention as defined in the following claims.

What is claimed is:

1. A fluidics head or a multiplicity of heads in an array thereof for automatically testing chemical and ionic sensing electronic circuit devices comprising:

a fluid confining cell having at least one open orifice to contain a known test fluid, means for filling said test fluid into said open orifice and discharging said test fluid from said open orifice when said orifice is in leakproof engagement with said sensing electronic circuit device to be tested, and means for providing electrical contacts to said sensing electronic circuit device so as to test said sensing electronic circuit device with said test fluid, wherein said open orifice has an internal shape such that fluid contamination in said fluid confining cell is minimized during discharge of said test fluid.

2. The fluidics head of claim 1 wherein said filling means comprises one inlet opening and one outlet opening in said fluid confining cell.

3. The fluidics head of claim 2 wherein the inlet opening and the outlet opening are at opposite ends of said confining cell.

4. The fluidics head of claim 2 wherein said open orifice is shaped so as to closely conform to the shape of said inlet and outlet openings.

5. The fluidics head of claim 1 wherein said fluid confining cell having at least one open orifice has an internal volume and geometry sufficient to ensure that bulk solution characteristics prevail during the testing of said sensing electronic circuit device.

6. The fluidics head of claim 1 wherein said fluid confining cell is shaped to prevent buckling when the open orifice of said fluid containing cell is urged into leakproof engagement with said sensing electronic circuit device to be tested.

7. The fluidics head of claim 6 wherein said fluid confining cell has a supportive structure which is wedge-like in shape with rounded outer edges to provide leakproof engagement with said sensing electronic circuit device to be tested.

8. The fluidics head of claim 1 wherein said fluid confining cell is formed from a material which is (a) chemically inert to the fluids used; (b) non-adsorptrve; (c) physically strong to provide controlled deformation and sealing and to resist buckling when urged against a circuit to be tested and during fluid flow; and (d) capable of providing air and fluid seal.

* * * * *